(12) United States Patent
Hallen

(10) Patent No.: US 6,320,467 B1
(45) Date of Patent: Nov. 20, 2001

(54) $F_T$ MULTIPLIER AMPLIFIER WITH LOW-POWER BIASING CIRCUIT

(75) Inventor: Thor Hallen, Beaverton, OR (US)

(73) Assignee: Credence Systems Corporation, Fremont, CA (US)

(*) Notice: Subject to any disclaimer, the term of this patent is extended or adjusted under 35 U.S.C. 154(b) by 0 days.

(21) Appl. No.: 09/561,445

(22) Filed: Apr. 28, 2000

(51) Int. Cl.[7] .................................................. H03F 3/45
(52) U.S. Cl. ...................................... 330/252; 330/261
(58) Field of Search .................................. 330/252, 257, 330/261, 296

(56) References Cited

U.S. PATENT DOCUMENTS

| | | |
|---|---|---|
| 3,633,120 | 1/1972 | Battjes . |
| 4,267,516 | 5/1981 | Traa . |
| 4,379,268 * | 4/1983 | Nagata .................................. 330/260 |
| 4,410,858 * | 10/1983 | Kusakabe ............................ 330/257 |
| 4,774,475 | 9/1988 | LaVoie . |
| 4,804,926 | 2/1989 | Woo . |
| 4,823,093 * | 4/1989 | Frey ...................................... 330/254 |
| 5,399,988 | 3/1995 | Knierim . |
| 5,699,010 * | 12/1997 | Hatanaka ............................. 327/563 |
| 5,999,051 * | 12/1999 | Terada et al. ....................... 330/254 |

* cited by examiner

Primary Examiner—Benny Lee
Assistant Examiner—Henry Choe
(74) Attorney, Agent, or Firm—David J. Bedell; Smith-Hill and Bedell

(57) ABSTRACT

An $F_t$ multiplier amplifier employs N similar differential amplifier stages, each including a differential transistor pair. Bases of each pair form stage inputs and collectors of each pair form stage outputs. Inputs of adjacent stages are connected in series by interconnecting the transistor bases of adjacent stages so that each stage receives and amplifies the same input current. Outputs of all stages are connected in parallel so that stage output currents are summed to produce an amplifier output current. Thus the current gain of the amplifier is N times the current gain of each amplifier stage. A set of bias circuits employ voltage dividers across inputs of adjacent stages to provide appropriate bias voltages at the node of connection between the adjacent stages. Each bias circuit also predicts the amount of current that interconnected transistor bases will draw from the node and supplies that predicted current to those transistors bases to compensate for errors the base currents would otherwise cause in the bias voltage provided by the voltage dividers.

12 Claims, 3 Drawing Sheets

$F_T$ MULTIPLIER AMPLIFIER WITH LOW-POWER BIASING CIRCUIT

BACKGROUND OF THE INVENTION

1. Field of the Invention

The present invention relates in general to transistor amplifiers and in particular to an $F_t$ doubler amplifier having a low-power biasing circuit.

2. Description of Related Art

Minority carrier charge storage in a bipolar transistor's base region causes it to behave electrically as a capacitor between its base and its emitter. This capacitance causes the transistor's current gain to decrease as the frequency of an input signal applied to its base increases.

The current gain of a transistor amplifier rolls off rapidly at higher input signal frequencies. The frequency at which the short circuit current gain of an amplifier falls to unity is commonly called the "current gain bandwidth" ($F_t$) of the amplifier. It is used as a measure of the ability of an amplifier to provide a combination of bandwidth and current gain. Thus amplifier design is a tradeoff between gain and bandwidth, and an amplifier having a higher $F_t$ gives a circuit designer more flexibility when making that tradeoff.

FIG. 1 illustrates a well-known "$F_t$ doubler" amplifier 10 employing two identical differential amplifier stages 12 and 14 arranged to amplify an input current $I_{IN}$ to produce an output current $I_{OUT}$ with twice the $F_t$ of a single-stage amplifier. Thus for example, amplifier 10 could provide approximately twice the current gain at a given bandwidth or approximately twice the bandwidth for a given current gain.

Amplifier stage 12 includes two transistors Q1 and Q2 having emitters linked by a resistor R1 and coupled to ground through biasing current sources I1 and I2. Identical differential amplifier stage 14 includes two transistors Q3 and Q4 having emitters linked by a resistor R2 and coupled to ground through biasing current sources I3 and I4. Resistors R7 and R8 bias bases of transistors Q1 and Q4, and bases of transistors Q2 and Q3 are interconnected. Amplifier stages 12 and 14 thus have inputs connected in series such that an input current signal $I_{IN}$ passes through both amplifier stage inputs. Thus each amplifier stage amplifies the same input current. The amplifier output differential currents $I_{OUT}$ appear at the interconnected collectors of transistors Q1 and Q3 and the interconnected collectors of transistors Q2 and Q4. Since the outputs (transistor collectors) of the two stages connected in parallel, their output currents are summed to produce $I_{OUT}$. Hence the current gain bandwidth of the two-stage amplifier 10 is twice that of an amplifier employing only a single stage.

When all transistors Q1–Q4 are properly biased, each stage operates with maximum dynamic range. One practical difficulty in implementing the amplifier circuit of FIG. 1 is in properly biasing the bases of transistors Q2 and Q3 to provide a bias voltage V3 that is equal to the common mode average of voltages V1 and V2 at the bases of transistor Q1 and Q4.

Some prior art $F_t$ doubler amplifier circuits use a simple voltage source 16 to bias the bases of transistors Q2 and Q3 to the correct bias voltage V3. To properly adjust the output voltage of source 16 it is necessary to accurately predict base voltages V1 and V2, but it is often not easy to do that.

FIG. 2 illustrates a prior art $F_t$ doubler amplifier employing a biasing circuit 18 that senses V1 and V2 and automatically generates the correct bias voltage V3 at the bases of transistors Q2 and Q3. Bias circuit 18 includes two resistors R3 and R4 and a unity (voltage) gain feedback amplifier 20. The matching resistors R3 and R4 connected in series between the bases of transistors Q1 and Q4 act as a voltage divider to produce the necessary bias voltage V3 = (V1+V2)/2 at the bases of transistors Q2 and Q3. The amplifier 20 isolates the bases of transistors Q2 and Q3 from resistors R3 and R4. If amplifier 20 were omitted so that R3 and R4 were directly connected to the bases of Q2 and Q3, the combined base bias current $I_B$ drawn by transistors Q2 and Q3 would be supplied through resistors R3 and R4. This would increase the voltage drops across resistors R3 and R4, thereby lowering the magnitude of V3 below the desired level. Since amplifier 20 has a high input impedance, it can supply the necessary base current $I_B$ while drawing little current through resistors R3 and R4, thereby maintaining V3 at the proper biasing level. One drawback to amplifier 20 is that since it is a feedback amplifier driving a capacitive load, it may be subject to instability under some conditions.

Nonetheless, the two-stage "$F_T$ doubler" amplifier of FIG. 2 is used in many applications. However it is not practical to expand the amplifier to include more than two stages so as to further multiply the $F_T$ of the amplifier. In the two-stage implementation illustrated in FIG. 2, the bias voltage V3 is substantially constant because it is the average of opposing two ends of a differential signal. Hence unity gain amplifier 20 amplifies a DC signal. If we were to expand the two-stage amplifier to include more than two stages, then the bias voltages that a set of unity-gain amplifiers would have to supply to junctions between successive stages would have to oscillate with the same frequency as the input signal because they would not be the common mode average of two ends of a differential signal. Thus the unity gain amplifiers would have be able to operate at impractically high frequencies.

What is needed is a simple, low-power circuit for automatically biasing the bases of transistors in an $F_T$ multiplier amplifier that is stable under all conditions and which permits the amplifier to employ more than two stages.

SUMMARY OF THE INVENTION

An $F_t$ multiplier amplifier in accordance with the invention employs N similar differential amplifier stages having inputs connected in series so that each receives and amplifies the same input current. Stage output currents are summed to produce an amplifier output current so that the current gain of the amplifier is N times the current gain of each amplifier stage. Each amplifier stage includes a differential transistor pair, and adjacent stages are connected in series by interconnecting the base of one transistor of a stage to the base of another transistor of the adjacent stage at a circuit node.

For each circuit node at a junction between adjacent amplifier stages, the amplifier includes a corresponding bias circuit having a voltage divider for providing an appropriate bias voltage to the circuit node equal to the common mode average voltage at the bases of the other transistors of the two adjacent stages.

In accordance with the invention the bias circuit also includes a reference transistor linked to the corresponding node through a current mirror. The reference transistor is sized and biased relative to the amplifier stage transistors so that it draws a base current proportional to the base current drawn by the bases of amplifier stage transistors connected to the node corresponding to the biasing circuit. The current mirror amplifies the base current of the reference transistor with an appropriate gain to supply a bias current into the circuit node matching the base current drawn by the amplifier stage transistors.

The bias circuit is stable because it does not employ a feedback amplifier, and by using small reference transistor and a current mirror with high gain, the bias circuit consumes very little power.

It is accordingly an object of the invention to provide multistage $F_T$ multiplier amplifier.

It is another object of the invention to provide a stable, low-power, circuit for automatically biasing the interconnected bases of transistors of an $F_T$ multiplier amplifier.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 3:
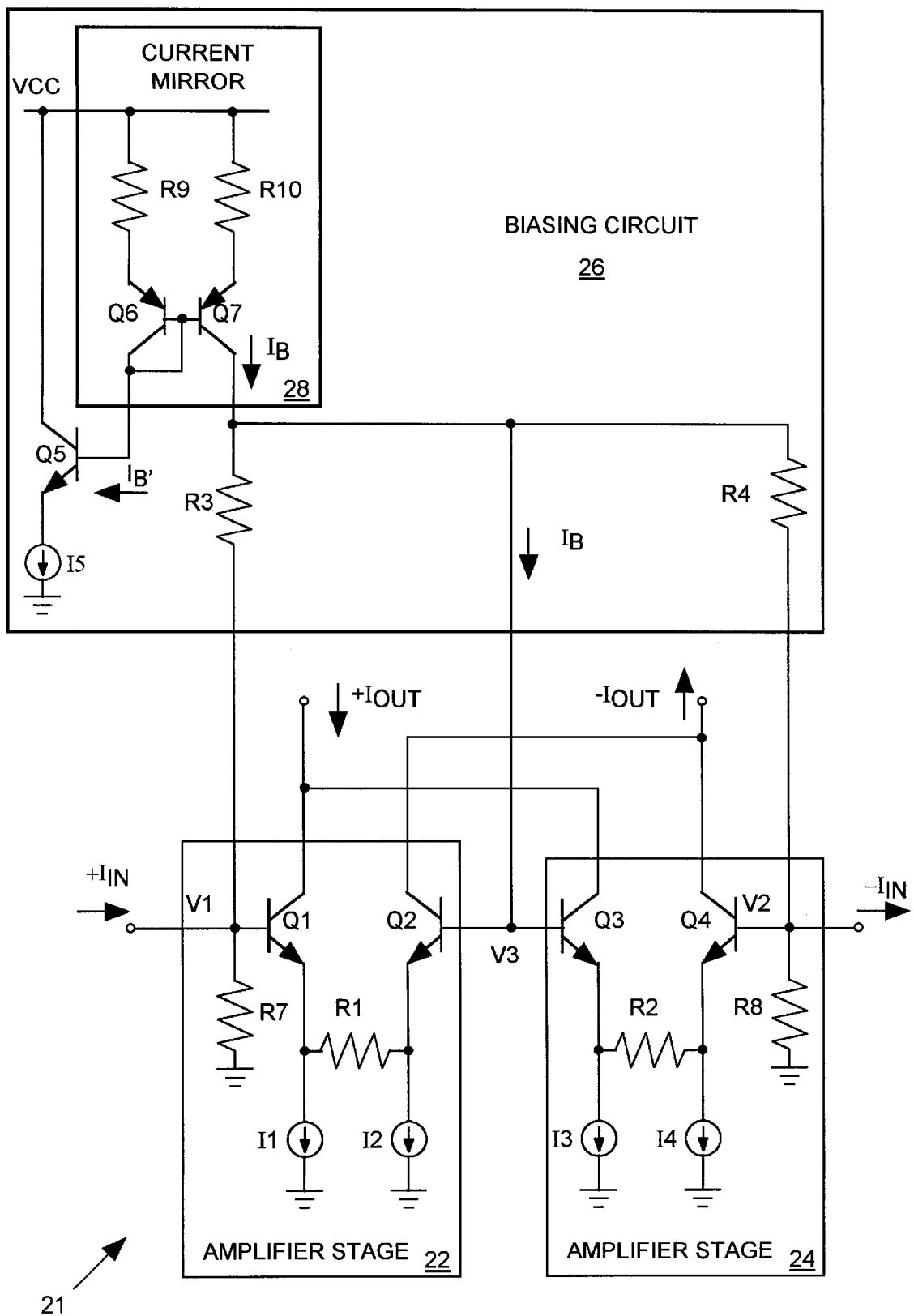
FIG. 3 illustrates a two-stage $F_T$ doubler amplifier in accordance with the present invention in schematic diagram form.

FIG. 3 illustrates in block diagram form an $F_t$ doubler amplifier 21 in accordance with the invention for producing a differential output current $I_{OUT}$ in response to a differential input current $I_{IN}$. Amplifier 21 includes two identical differential amplifier stages 22 and 24 connected in series such that each amplifies the same differential input $I_{IN}$ to produce an output currents of similar magnitude. The output currents of the two stages are summed to produce an amplifier output current $I_{OUT}$ twice as large as the output current of each stage 22, 24. A biasing circuit 26 in accordance with the invention appropriately biases the junction between amplifier stages 22 and 24 so that it is held at a base voltage V3 equal to the common mode average of voltages V1 and V2 at the other inputs of stages 22 and 24.

Amplifier Stages

Amplifier stage 22 is a conventional differential amplifier including two transistors Q1 and Q2 having emitters interconnected through a resistor R1, with each emitter linked to a separate biasing current source I1, I2. Amplifier stage 24, similar to stage 22, includes two transistors Q3 and Q4 having emitters linked through a resistor R2 and coupled to separate biasing current sources I3, I4. Resistors R7 and R8 bias bases of transistors Q1 and Q4. The bases of Q2 and Q3 are interconnected so that input current signal $I_{IN}$ passes through both amplifier stages 22 and 24. Thus each stage 22 and 24 amplifies input current $I_{IN}$ to produce an output current at the collectors of their transistors Q1/Q2 or Q3/Q4 with a gain determined by transistor biasing. The collector of transistor Q1 is connected to the collector of Q3 and the collector of Q2 is connected to the collector of transistor Q4 so that the differential output currents of the two stages 22 and 24 are summed to produce the amplifier output current $I_{OUT}$. Since the two stages 22 and 24 are identical and amplify the same input current, they each produce a similar differential output current at the collectors of their transistors Q1/Q2 or Q3/Q4. Thus amplifier 21 has the same bandwidth as each amplifier stage 22 and 24 but provides approximately twice the current gain as each stage 22 and 24.

Bias Circuit

To ensure both amplifier stages 22 and 24 substantially realize their full dynamic range potential, it is necessary for biasing circuit 26 to bias the bases of transistors Q2 and Q3 to a bias voltage V3 equal to a common mode average voltage (V1+V2)/2, where V1 is the input voltage at the base of transistor Q1, and V2 is the input voltage at the base of transistor Q4. Biasing circuit 26 includes a resistor R3 connected between the bases of transistors Q1 and Q2 and a matching resistor R4 connected between the bases of transistors Q3 and Q4. Resistors R3 and R4 act as a voltage divider to produce the desired bias voltage V3 at the bases of transistors Q2 and Q3. Resistors R3 and R4 are suitably made large so that the do not shunt a significant amount of input current $I_{IN}$ around amplifier stages 22 and 24.

The bases of transistors Q2 and Q3 draw a current $I_B$. For resistors R3 and R4 to set V3 equal to (V1+V2)/2, biasing circuit 26 must ensure that the bases of transistors Q2 and Q3 draw none of their current $I_B$ through resistors R3 and R4. If all of current $I_B$ were supplied in via resistors R3 and R4 then V3 would be reduced from the desired average voltage (V1+V2)/2 by $I_B R$, where R is the resistance of resistors R3 and R4. Thus amplifier stages 22 and 24 would not operate at their full dynamic range potential. Biasing circuit 26 supplies the necessary base current $I_B$ to the of transistors Q2 and Q3 so that the base current does not have to pass through resistors R3 and R4.

Biasing circuit 26 includes a reference transistor Q5 having a collector connected to a power supply VCC and an emitter coupled to a current source I5. Reference transistor Q5 is sized relative to transistors Q1–Q4 and current source I5 is sized relative to sources I1–I4 such that reference transistor Q5 draws a base current $I_{B'}$ that is K times smaller than the combined base current $I_B$ drawn by transistors Q2 and Q3 under all conditions. Bias circuit 26 also includes a current mirror 28 formed by a pair of transistors Q6 and Q7 and a pair of resistors R9 and R10 linking the emitters of transistors Q6 and Q7 to voltage source VCC. The bases of transistors Q6 and Q7 the collector of transistor Q6 are linked to the base of transistors Q5, while the collector of transistor Q7 is tied to the bases of transistors Q2 and Q3.

Transistors Q6 and Q7 and resistors R9 and R10 are sized so that the collector current of transistor Q7 is K times the base current $I_{B'}$ of transistor Q6. Since current $I_{B'}$ is equal to $I_B/K$, and the current mirror gain is K, the collector current of transistor Q7 is equal to $I_B$. Therefore transistor Q7 supplies all of the base current $I_B$ needed by transistors Q2 and Q3, and none of that base current passes though resistors R3 or R4. Thus the bias voltage V3 of transistors Q2 and Q3 resides at the desired common mode average of voltages V1 and V2 under all circuit operating conditions. Since biasing circuit 26 is not a feedback circuit, it is not subject to instability.

The value of K (the ratio $I_B/I_{B'}$ and the current gain of current mirror 28) is a positive number and not necessarily an integer. We can choose K by first selecting a reference transistor Q5 that is smaller than transistor Q2 or Q3 but which is fabricated by the same process, preferably on the same integrated circuit. This ensures $I_{B'}$ will remain equal $I_B/K$ even when $I_B$ varies. The gain of current mirror 28 can be adjusted by adjusting the relative sizes of transistors Q6 and Q7 and resistors R9 and R10.

We can keep the power consumption of biasing circuit 26 low by choosing a reasonably large value for K. This limits the current source I5 must draw through reference transistor Q5. However when the value of K is too large, reference transistor Q5 fails to draw a base current $I_{B'}$ sufficient to maintain current mirror 28 within its linear operating range for which its gain is K, and the biasing circuit will therefore fail to provide the appropriate base current magnitude.

N-stage $F_T$ Multiplier Amplifier

Figure 4:
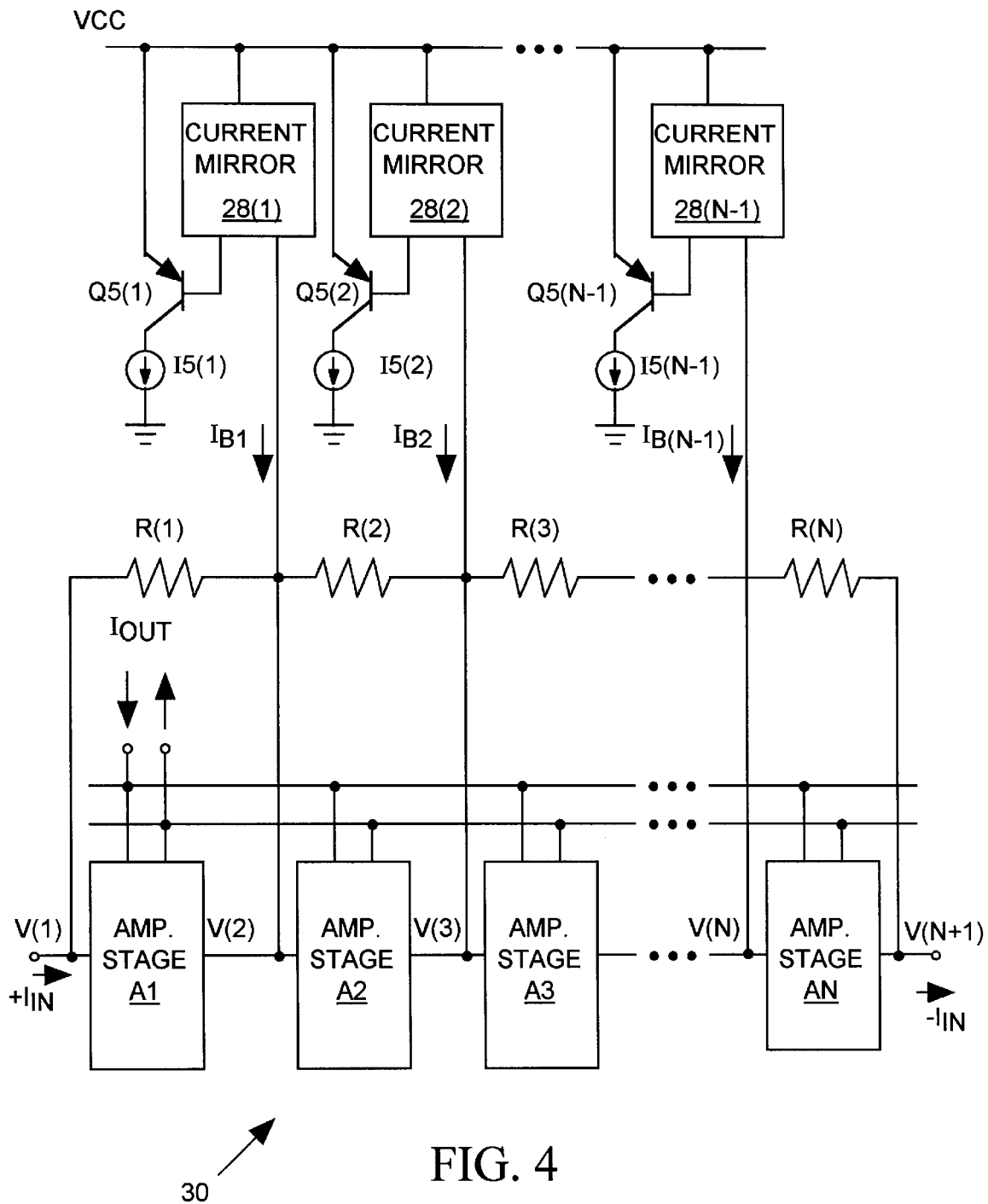
FIG. 4 illustrates an N-stage $F_T$ doubler amplifier in accordance with the present invention in block diagram form.

FIG. 4 illustrates an amplifier 30 in accordance with the invention having N amplifier stages A1–AN, each similar to a stage 22 or 24 of FIG. 3. Amplifier inputs are connected in series so that each amplifier stage A1–AN amplifies the same input current $I_{IN}$. Output terminals of all amplifier stages A1–AN are connected in parallel, thereby summing their output currents to produce to amplifier output current IOUT. Thus amplifier 30 produces an output current $I_{OUT}$ that is N times greater than the output current of each individual stage A1–AN.

Figure 1:
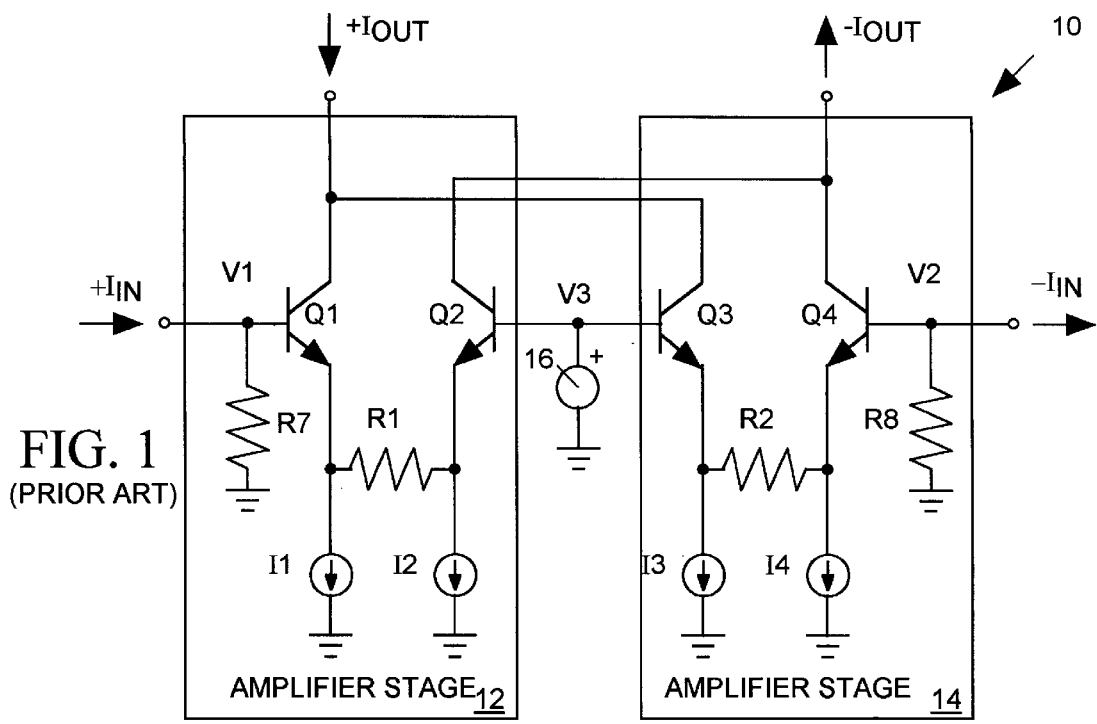
FIGS. 1 and 2 illustrate prior art $F_t$ doubler amplifiers in schematic diagram form.
Figure 2:
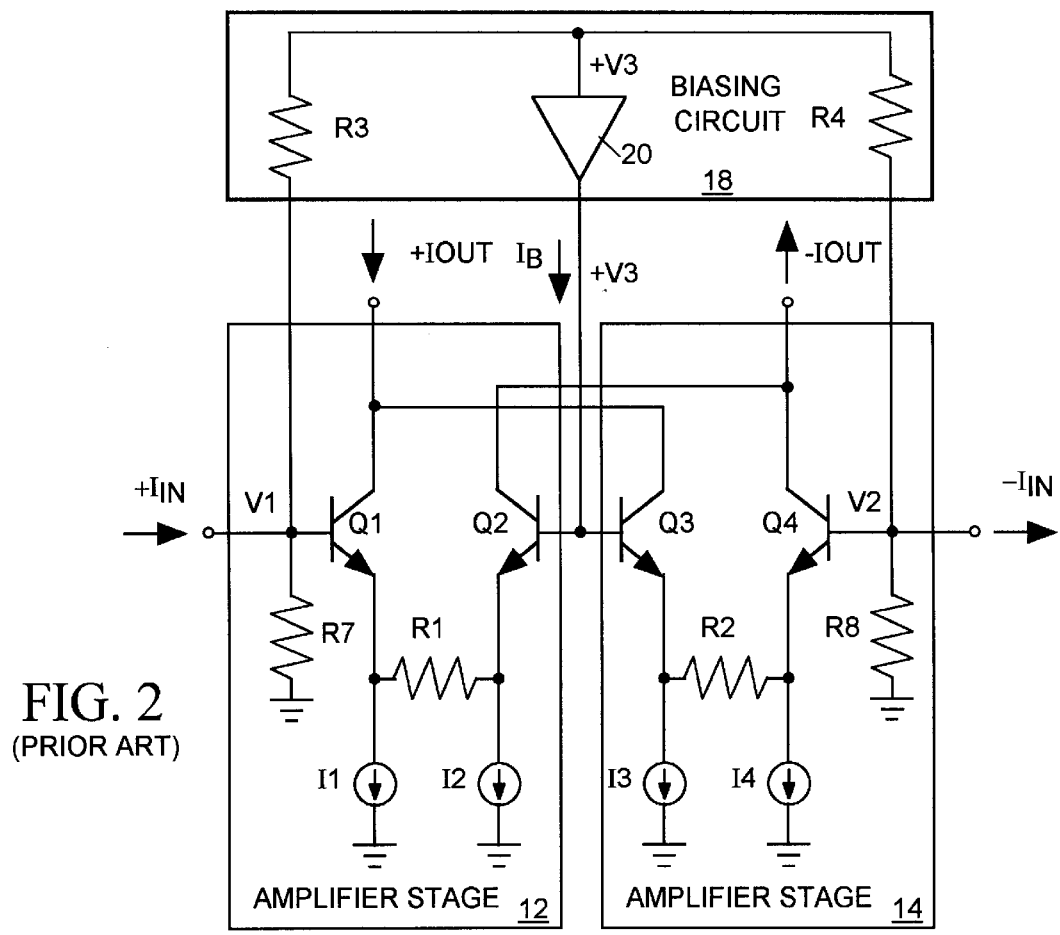

A set of resistors R(1)–R(N) connected across the inputs of each stage A1–AN acts as a voltage divider to supply an appropriate bias voltage V(2)–V(N) to each junction between adjacent pairs of amplifier stages A1–AN. A set of transistors Q5(1)–QS(N–1) and current sources I5(1)–I5(N–1) similar to transistor QS and current source I5 of FIG. 2 provide reference currents to a set of current mirrors 28(1)–28(N–1) similar to current mirror 28 of FIG. 3. The current mirrors produce the appropriate bias current inputs $I_{B1}$–$I_{B(N-1)}$ to the junctions between adjacent amplifier stages A1–AN.

Thus has been described an amplifier employing N similar amplifier stages having inputs connected in series and outputs connected in parallel to provide a current gain that is approximately N times that each amplifier stage. The amplifier employs one or more stable, low-power biasing circuits in accordance with the invention for appropriately biasing junctions between the amplifier stage inputs. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

I claim:

1. An amplifier for amplifying an input current to produce an amplifier output current in response to an input current the amplifier comprising:

first, second, and third nodes, said input current being received by the first node;

a first amplifier stage connected between said first node and said second node such that said input current passes between said first node and said second node via said first amplifier stage, wherein said first amplifier stage amplifies said input current to produce a first portion of said amplifier output current;

a second amplifier stage connected between said second node and said third node such that said input current passes between said second node and said third node via said second amplifier stage, wherein said second amplifier stage amplifies said input current to produce a second portion of said amplifier output current, wherein said first and second amplifier stages include amplifier transistors drawing a bias current of a magnitude $I_B$ from said second node;

a reference transistor (Q5) sized and biased in relation to at least one amplifier transistor of said first and second amplifier to produce a base current of magnitude $I_{B'}$ substantially equal to $I_B$ divided by a constant K; and means receiving said base current for generating in response thereto with a current gain substantially equal to K a bias current of magnitude $I_B$, and for supplying said bias current to said second node.

2. The amplifier in accordance with claim 1 wherein said constant K is greater than one.

3. The amplifier in accordance with claim 1 wherein said means receiving said base comprises a current mirror.

4. The amplifier in accordance with claim 1 further comprising a current source for biasing said reference transistor.

5. The amplifier in accordance with claim 1 wherein said amplifier transistors and said reference transistor reside within a same integrated circuit.

6. The amplifier in accordance with claim 1 further comprising:

a first resistor (R3) connected between said first node and said second node; and a second resistor (R4) connected between said first node and said second node.

7. The amplifier in accordance with claim 1 wherein said first amplifier stage comprises:

first and second amplifier transistors (Q1 and Q2), each having a base, an emitter and a collector, the base of said first amplifier transistor being connected to said first node, the base of said second amplifier transistor being connected to said second node, wherein said base of said second amplifier transistor draws a first portion of said bias current from said second node;

a first resistor (R1) connected between emitters of said first and second amplifier transistors;

a first current source (I1) connected to the emitter of said first amplifier transistor;

a second current source (I2) connected to the emitter of said second amplifier transistor, and wherein said second amplifier stage comprise:

third and fourth amplifier transistors (Q3 and Q4), each having a base, an emitter and a collector, the base of said third amplifier transistor being connected to said second node, the base of said fourth amplifier transistor being connected to said third node, wherein said base of said third amplifier transistor draws a second portion of said bias current from said second node;

a third resistor (R3) connected between emitters of said first and second amplifier transistors;

a third current source (I3) connected to the emitter of said third amplifier transistor;

a fourth current source (I24 connected to the emitter of said fourth amplifier transistor.

8. The amplifier in accordance with claim 7 wherein said reference transistor (Q5) is sized and biased in relation to said second and third amplifier transistors so that it produces a base current of magnitude $I_{B'}$ substantially equal to a bias current drawn by said second and third amplifiers.

9. An amplifier for amplifying an input current to produce an amplifier output current in response to an input current the amplifier comprising:

first, second, and third nodes, said input current being received by the first node;

first and second amplifier transistors (Q1 and Q2), each having a base, an emitter and a collector, the base of said first amplifier transistor being connected to said first node, the base of said second amplifier transistor being connected to said second node, wherein said base of said second amplifier transistor draws a first portion of said bias current from said second node;

a first resistor (R1) connected between emitters of said first and second amplifier transistors;

a first current source (I1) connected to the emitter of said first amplifier transistor;

a second current source (I2) connected to the emitter of said second amplifier transistor;

third and fourth amplifier transistors (Q3 and Q4), each having a base, an emitter and a collector, the base of said third amplifier transistor being connected to said second node, the base of said fourth amplifier transistor being connected to said third node, wherein said base of said third amplifier transistor draws a second portion of said bias current of magnitude $I_B$ from said second node;

a third resistor (R3) connected between emitters of said first and second amplifier transistors;

a third current source (I3) connected to the emitter of said third amplifier transistor;

a fourth current source (I4) connected to the emitter of said fourth amplifier transistor;

a reference transistor (Q5) having an emitter, a base and a collector a fifth current source connected to the emitter of said reference transistor, said fifth current source and said reference transistor being sized relative to said second and third transistors such that said reference transistor produces a base current of magnitude $I_{B'}$ substantially equal to a $I_B$ divided by a constant K; and a current mirror receiving said base current for generating in response thereto with a current gain substantially equal to K a bias current of magnitude $I_B$, and for supplying said bias current to said second node.

10. The amplifier in accordance with claim 9 wherein said constant K is greater than one.

11. The amplifier in accordance with claim 9 wherein said amplifier transistors and said reference transistor reside within a same integrated circuit.

12. The amplifier in accordance with claim 1 further comprising:

a first resistor (R3) connected between said first node and said second node; and a second resistor (R4) connected between said first node and said second node.

* * * * *